United States Patent
Yonaga

(10) Patent No.: US 7,225,379 B2
(45) Date of Patent: May 29, 2007

(54) CIRCUIT AND METHOD FOR TESTING SEMICONDUCTOR DEVICE

(75) Inventor: Takeru Yonaga, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 271 days.

(21) Appl. No.: 11/065,370

(22) Filed: Feb. 25, 2005

(65) Prior Publication Data

US 2005/0240842 A1 Oct. 27, 2005

(30) Foreign Application Priority Data

Apr. 23, 2004 (JP) .............................. 2004-128651

(51) Int. Cl.
*G01R 31/3193* (2006.01)
*G06F 11/277* (2006.01)

(52) U.S. Cl. ...................... 714/744; 365/201

(58) Field of Classification Search ................ 714/733, 714/735, 738, 744; 365/201
See application file for complete search history.

(56) References Cited

U.S. PATENT DOCUMENTS 6,823,413 B2 * 11/2004 Fujiki .......................... 710/260

FOREIGN PATENT DOCUMENTS

JP 11032043 A * 2/1999
JP 2004-093421 3/2004

* cited by examiner

*Primary Examiner*—Cynthia Britt
(74) *Attorney, Agent, or Firm*—Nixon Peabody LLP; Donald R. Studebaker

(57) ABSTRACT

A test circuit includes: a register circuit, into which data is written after data is cleared in compliance with a reset instruction, the register circuit holding the written data until a subsequent reset instruction is input; a TAP controller which receives a signal for selecting a test mode, and writes the data into the register circuit in accordance with the signal for selecting a test mode in synchronization with a first clock; a pattern generation circuit which generates a test pattern in accordance with the data held in the register circuit, and outputs data based on the test pattern to the circuit to be tested in synchronization with a second clock; and a data comparator which receives data output from the circuit to be tested in synchronization with the second clock, and makes an evaluation of performance in accordance with the test pattern and the data output from the circuit to be tested.

13 Claims, 9 Drawing Sheets

CIRCUIT AND METHOD FOR TESTING SEMICONDUCTOR DEVICE

BACKGROUND OF THE INVENTION

1. Field of the Invention

The present invention relates to a test circuit such as a built-in self test (BIST) circuit and method for testing a high-speed semiconductor memory or other circuits to be tested, and a semiconductor integrated circuit device including a test circuit and a logic circuit (a CPU, for instance) disposed in the same semiconductor substrate.

2. Description of the Related Art

A variety of test circuits for testing the performance of a semiconductor integrated circuit such as a semiconductor memory have been proposed. For instance, Japanese Patent Application Kokai (Laid-Open) Publication No. 2004-93421 discloses a BIST circuit for testing a synchronous dynamic random access memory (SDRAM). The BIST circuit receives a test input pattern (a test clock tck, a test mode signal tms, and a test data input signal tdi) which is a standard serial interface signal conforming to the JTAG standard, for instance, generates a test pattern based on a test mode selection signal ctrl determined in accordance with the test mode signal tms and the test data input signal tdi, and tests an SDRAM as a circuit to be tested using the generated test pattern.

However, the conventional BIST circuit described above is configured to test the SDRAM while a test input pattern (a test clock tck, a test mode signal tms, and a test data input signal tdi) is being supplied. Therefore, if the input test pattern is interrupted or modified while the SDRAM is being tested, the test may be aborted or may be disabled.

SUMMARY OF THE INVENTION

An object of the present invention is to provide a test circuit and a test method with which a given test can be finished without any interruption even if an input test pattern is interrupted or modified during the test.

Another object of the present invention is to provide a semiconductor integrated circuit device utilizing the test circuit so that the footprint and the testing time can be reduced.

According to the present invention, a test circuit includes: a register circuit, into which data is written after data is cleared in compliance with a reset instruction executed by a reset signal, the register circuit holding the written data until a reset instruction is executed by a subsequent reset signal; a first circuit which receives a signal for selecting a test mode to be applied for testing a circuit to be tested, and writes the data into the register circuit in accordance with the signal for selecting a test mode in synchronization with a first clock; a second circuit which generates a test pattern in accordance with the data held in the register circuit, and outputs data based on the test pattern to the circuit to be tested in synchronization with a second clock; and a third circuit which receives data output from the circuit to be tested in synchronization with the second clock, and makes an evaluation of performance of the circuit to be tested in accordance with the test pattern and the data output from the circuit to be tested.

Further, according to the present invention, a semiconductor integrated circuit device includes the above-mentioned test circuit formed on a semiconductor substrate; a logic circuit formed on the semiconductor substrate; a first common wiring which is formed on the semiconductor substrate and connected to both the first circuit of the test circuit and the logic circuit; and a first common terminal which is formed on the semiconductor substrate and connected to the first common wiring.

Furthermore, according to the present invention, a method for testing a circuit to be tested, using a test circuit including a register circuit, into which data is written after data is cleared in compliance with a reset instruction executed by a reset signal, the register circuit holding the written data until a reset instruction is executed by a subsequent reset signal. The method includes: supplying the test circuit with a signal for selecting a test mode to be applied for testing a circuit to be tested, and writing the data into the register circuit in accordance with the signal for selecting a test mode in synchronization with a first clock; generating a test pattern in accordance with the data held in the register circuit, and outputting data based on the test pattern to the circuit to be tested in synchronization with a second clock; and supplying the test circuit with data output from the circuit to be tested in synchronization with the second clock, and making an evaluation of performance of the circuit to be tested in accordance with the test pattern and the data output from the circuit to be tested.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of <First Embodiment>

Figure 1:
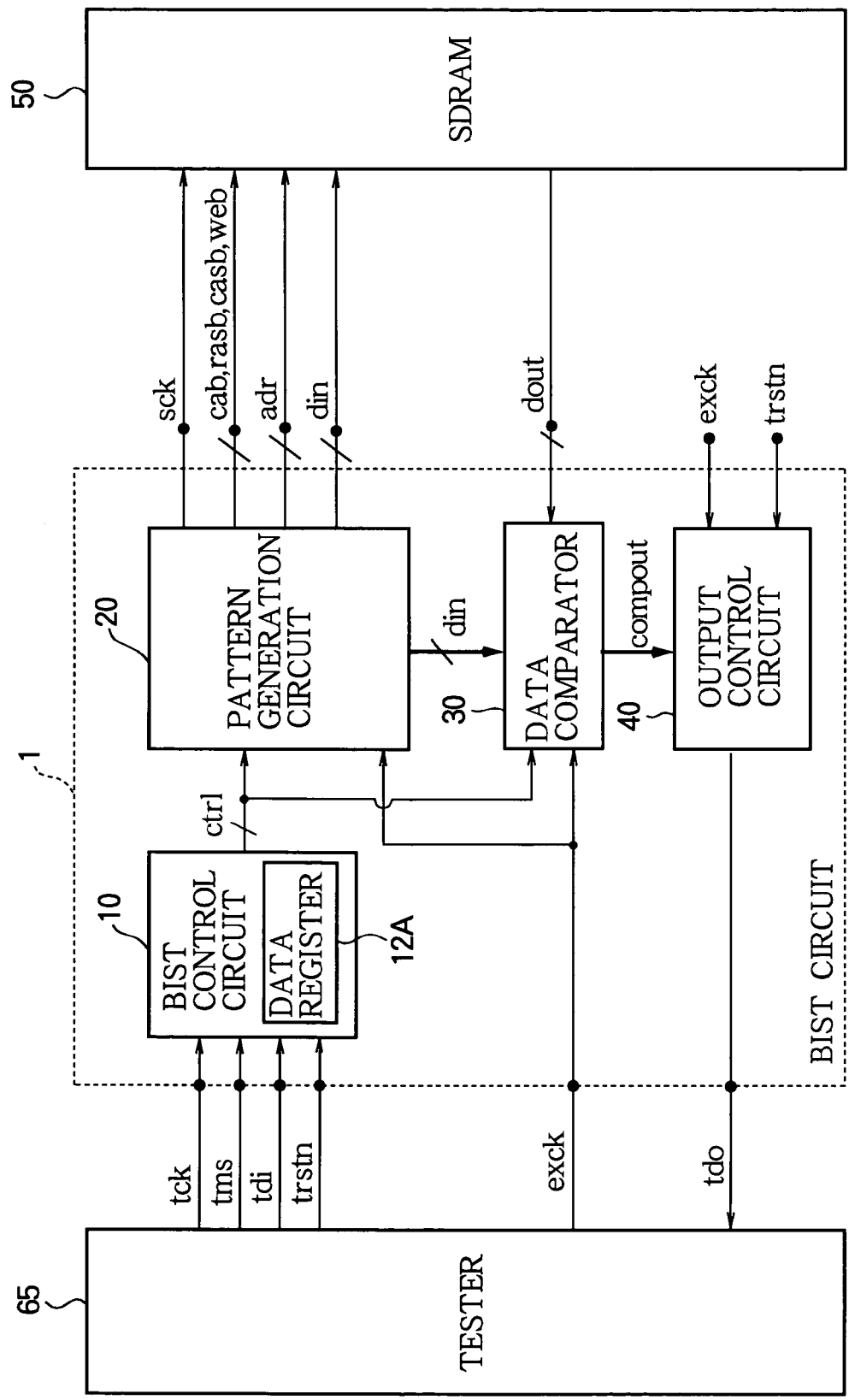
FIG. 1 is a block diagram showing a schematic configuration of a BIST circuit, which is a test circuit of a first embodiment of the present invention, a tester, and an SDRAM.
Figure 2:
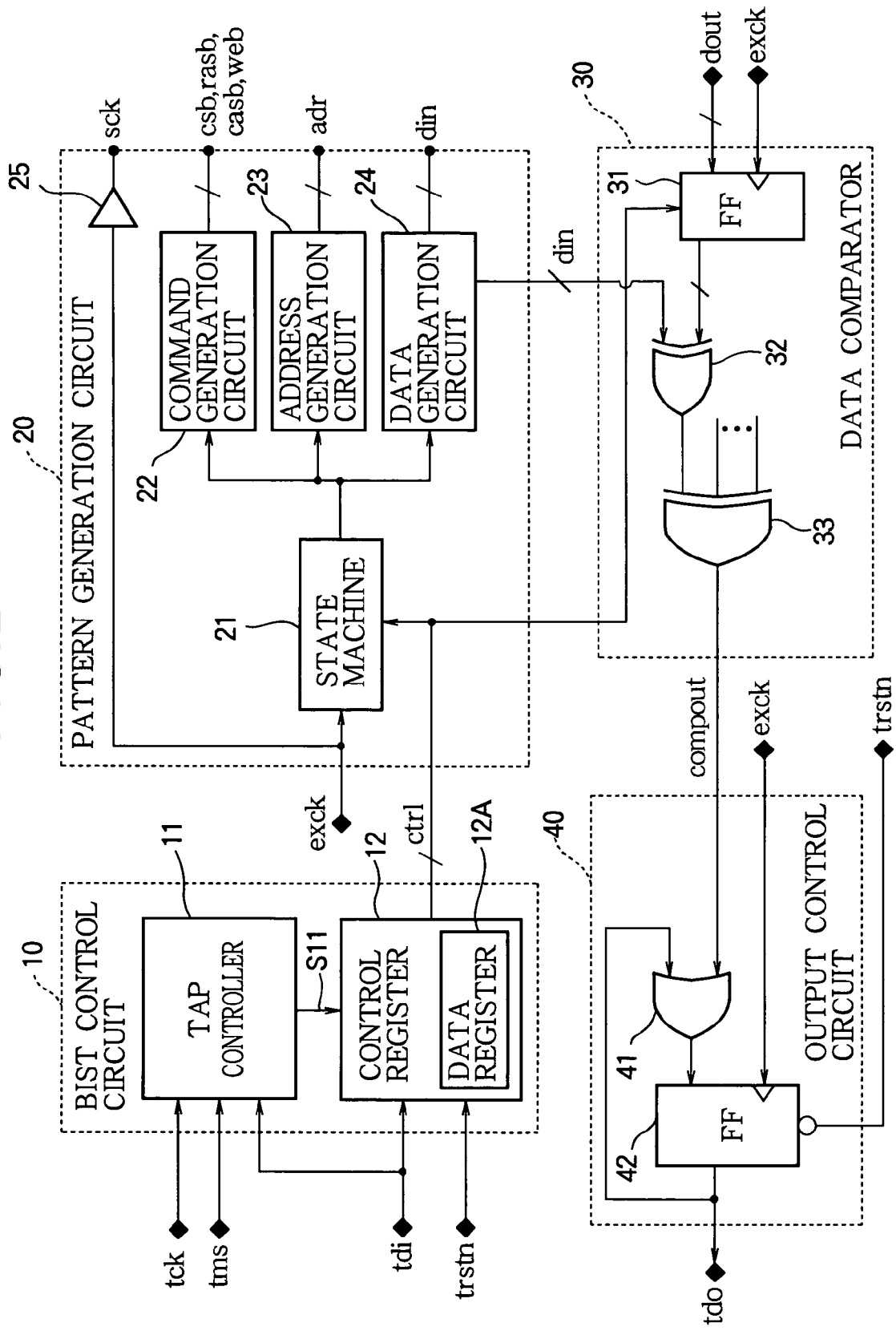
FIG. 2 is a block diagram showing a schematic configuration of the BIST circuit shown in FIG. 1.

FIG. 1 is a block diagram showing a schematic configuration of a BIST circuit 1, which is a test circuit of a first embodiment of the present invention, a tester 65 connected to the BIST circuit 1, and an SDRAM 50, which is a circuit to be tested. FIG. 2 is a block diagram showing a schematic configuration of the BIST circuit 1 shown in FIG. 1.

The BIST circuit 1 is a circuit for generating a command of the SDRAM 50 (one type of semiconductor memory), which is a circuit to be tested, in order to test the SDRAM 50. In FIG. 1, the BIST circuit 1 is connected to the tester 65. The BIST circuit 1 includes a BIST control circuit 10 to which a signal supplied from the tester 65 is input, a pattern generation circuit 20, a data comparator 30, and an output control circuit 40. An output signal ctrl of the BIST control circuit 10 is supplied to the pattern generation circuit 20 and the data comparator 30. An output signal compout of the data comparator 30 is supplied to the output control circuit 40. The BIST control circuit 10, the pattern generation circuit 20, the data comparator 30, and the output control circuit 40 are formed on the same semiconductor substrate, for instance.

The BIST control circuit 10 receives data for selecting a test mode for the SDRAM 50 or the like from the tester 65, for instance. In the first embodiment, the BIST control circuit 10 receives a test clock tck, which is a first clock of about 40 MHz, a test mode signal tms, a test data input signal tdi, and a test reset signal trstn, which are standard serial interface data conforming to the JTAG standard. The BIST control circuit 10 outputs a multibit BIST control signal ctrl indicating a result of test mode selection, to the pattern generation circuit 20, in synchronization with the input test clock tck. In the first embodiment, the BIST control circuit 10 includes a data register 12A, which is a circuit for holding the BIST control signal ctrl indicating the result of test mode selection.

The pattern generation circuit 20 receives the BIST control signal ctrl and an external clock exck (an external clock of 100 MHz or higher, for instance) supplied from the tester 65. The pattern generation circuit 20 responds to the input BIST control signal ctrl and generates a test pattern in synchronization with the external clock exck. The test pattern includes a clock sck (a clock synchronized with the external clock exck), multibit commands (control signals) csb, rasb, casb, and web, a multibit address adr, and multibit input data din, which are input signals to the SDRAM 50. The clock sck, the commands csb, rasb, casb, and web, the address adr, and the input data din are supplied to the SDRAM 50. The pattern generation circuit 20 also outputs the input data din as an expected value to the data comparator 30.

The control signal csb output from the pattern generation circuit 20 is an active-low chip select signal for selecting one of memory cell arrays provided in the SDRAM 50. The control signal rasb output from the pattern generation circuit 20 is an active-low row address strobe signal for latching a row address and selecting a word line or refreshing a memory cell according to the row address. The control signal casb output from the pattern generation circuit 20 is an active-low column address strobe signal for latching a column address, selecting a bit line according to the column address, and making a read or write operation. The control signal web output from the pattern generation circuit 20 is an active-low write enable signal for determining a read or write mode for the memory cell selected by the row address and the column address.

The data comparator 30 receives an output data dout, which is a test result of the SDRAM 50, the BIST control signal ctrl, and the test pattern (an expected value, which is multibit input data din, for instance) supplied to the SDRAM 50, in synchronization with external clock exck. The data comparator 30 compares the input data din as the expected value with the output data dout from the SDRAM 50, and outputs a result compout of the comparison indicating whether the input data din and the output data dout match or do not match, to the output control circuit 40.

The output control circuit 40 receives and holds the comparison result compout. The output control circuit 40 outputs a test data output signal tdo corresponding to the comparison result compout to the tester 65, in synchronization with the external clock exck supplied from the tester 65.

Figure 3:
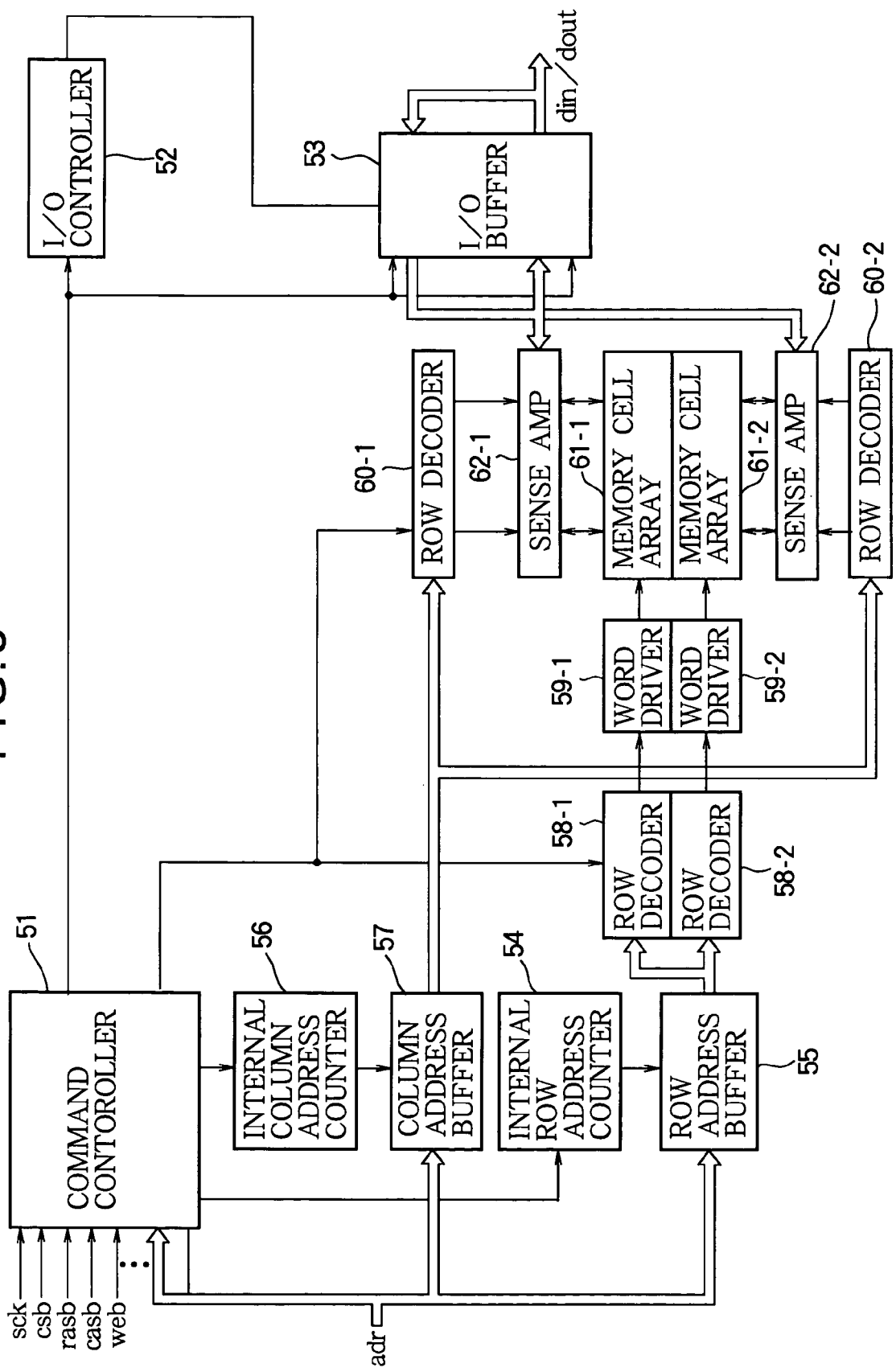
FIG. 3 is a block diagram showing a schematic configuration of the SDRAM shown in FIG. 1.

FIG. 3 is a block diagram showing a schematic configuration of the SDRAM 50 shown in FIG. 1.

When the commands csb, rasb, casb, and web supplied from the pattern generation circuit 20 shown in FIG. 1 are given to a command controller 51 in the SDRAM 50, the command controller 51 outputs a plurality of control signals for controlling the entire SDRAM in synchronization with the clock sck. When the control signals output from the command controller 51 are supplied to an input/output (I/O) controller 52 and an I/O buffer 53, the data din is input to or the data dout is output from the I/O buffer 53 as controlled by the I/O controller 52.

When the address adr supplied from the pattern generation circuit 20 is given to the SDRAM 50, a row address buffer 55 having the output address specified by an internal row address counter 54 holds the address adr. The address adr is decoded by row decoders 58-1 and 58-2, and the corresponding word line in memory cell arrays 61-1 and 61-2 is selected as driven by word drivers 59-1 and 59-2. The address adr is also held in a column address buffer 57 having an output address specified by an internal column address counter 56. The address adr is decoded by column decoders 60-1 and 60-2, and the corresponding bit line is selected in memory cell arrays 61-1 and 61-2. The input data din supplied from the I/O buffer 53 is written into the memory cell connected to the selected word line and the selected bit line, or the stored data is read from the memory cell. The read data is amplified by sense amplifiers 62-1 and 62-2, and then output from the I/O buffer 53 as the output data dout.

With reference to FIG. 2, the configuration of the BIST circuit 1 of the first embodiment will be described in further detail.

The BIST control circuit 10 includes a TAP controller 11 and a control register 12. The output of the TAP controller 11 is connected to the control register 12. The TAP controller 11 receives a serial test clock tck, a test mode signal tms, and a serial test data input signal tdi, and outputs register control signals S11 to the control register 12. The control register 12 receives the register control signals S11, the serial test data input signal tdi, and the test reset signal trstn. The control register 12 generates the multibit BIST control signals ctrl, which is set to 1 (high) for activation, holds the signals ctrl in an internal data register 12A, and supplies the BIST control signals ctrl (ctr10, ctr11, ctr12) to the pattern generation circuit 20 and the data comparator 30.

The pattern generation circuit 20 includes a state machine 21, a command generation circuit 22, an address generation circuit 23, a data generation circuit 24, and a buffer 25. The command generation circuit 22, the address generation circuit 23, and the data generation circuit 24 are connected to the output of the state machine 21, and the buffer 25 is connected to the input of the state machine 21. When the BIST control signal ctrl supplied from the control register 12 goes high, the state machine 21 goes into action, generates multiple types of states in synchronization with the input external clock exck, and outputs control signals for controlling the command generation circuit 22, the address generation circuit 23, and the data generation circuit 24. The buffer 25 is driven by the external clock exck and gives the clock sck to the SDRAM 50.

As controlled by the state machine 21, the command generation circuit 22 generates the multibit commands csb, rasb, casb, and web, the address generation circuit 23 generates the multibit address adr, and the data generation circuit 24 generates the multibit input data din. These signals are supplied to the SDRAM 50 as a test pattern.

The data comparator 30 operates in accordance with the BIST control signal ctrl, and includes a flip-flop (FF) circuit 31, which takes the multibit output data dout from the SDRAM 50 in synchronization with the external clock exck. On the output side of the FF circuit 31, a two-input exclusive OR gate (XOR circuit) 32 for comparing data and a multi-input XOR circuit 33 for comparing data are cascaded. The XOR circuit 32 compares the multibit output data dout of the SDRAM 50 taken by the FF circuit 31 and the multibit input data din of the expected values supplied from the data generation circuit 24. The output of the XOR circuit 32 is brought high by an anticoincidence of the two inputs and is brought low by a coincidence of the two inputs. The XOR circuit 33 connected to the output of the XOR circuit 32 compares the individual output signals of the XOR circuit 32 and outputs the results compout of comparison to the output control circuit 40.

The output control circuit 40 includes a two-input logical OR gate (OR circuit) 41 and a flip-flop circuit 42. The two-input logical OR gate (OR circuit) 41 receives the comparison result compout and the serial test data output signal tdo. The FF circuit 42 is connected to the output of the OR circuit 41 and holds the output signal. The FF circuit 42 holds the output signal of the OR circuit 41 in synchronization with the external clock exck and sends the held result back to the input of the OR circuit 41. The FF circuit 42 is cleared by the test reset signal trstn. If the comparison result compout is high, the output control circuit 40 holds the signal and outputs the serial test data output signal tdo corresponding to the held contents to the tester 65, in synchronization with the external clock exck. The high signal held in the circuit is cleared by the test reset signal trstn.

Figure 4:
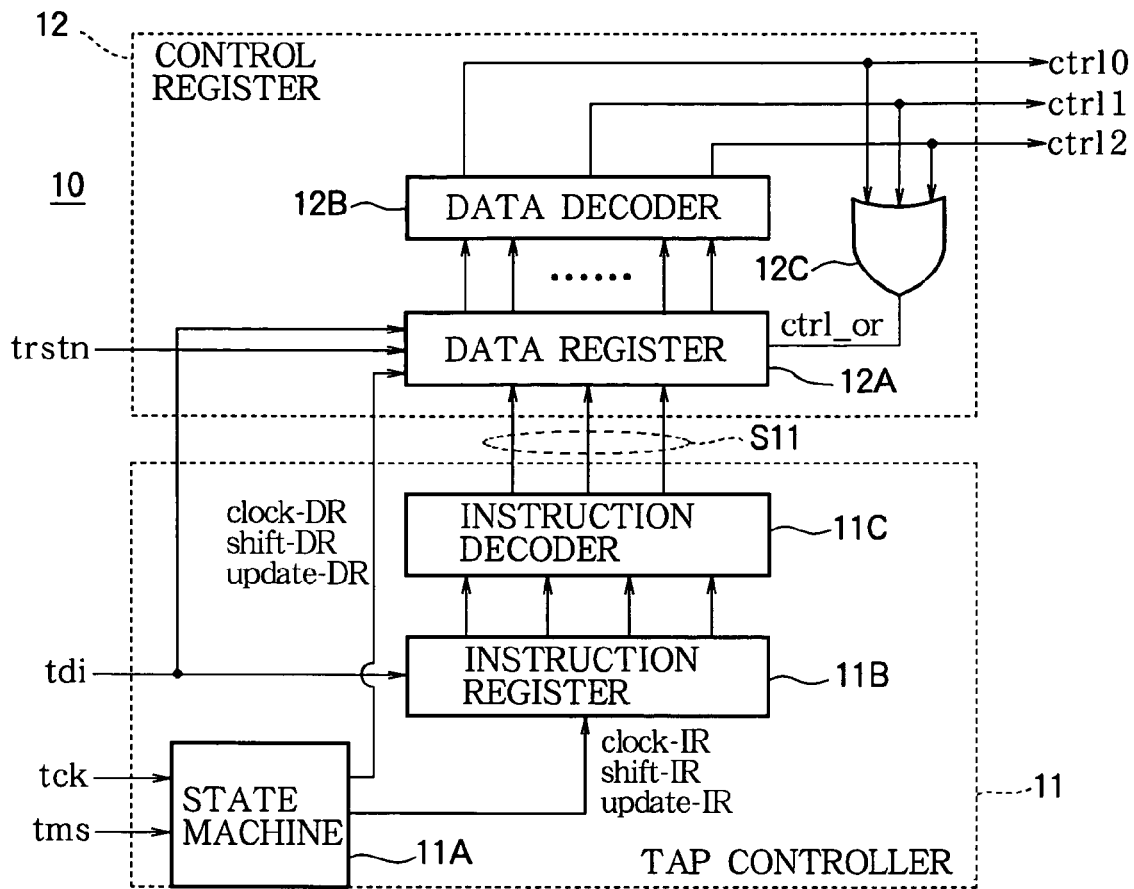
FIG. 4 is a block diagram showing a schematic configuration of the BIST control circuit shown in FIG. 2.

FIG. 4 is a block diagram showing a schematic configuration of the BIST control circuit 10 shown in FIG. 1 and FIG. 2.

The TAP controller 11 included in the BIST circuit 10 contains a state machine 11A, an instruction register 11B, and an instruction decoder 11C. The control register 12 included in the BIST circuit 10 contains a multibit data register 12A for holding data, a multibit data decoder 12B, and a three-input OR circuit 12C.

The state machine 11A of the TAP controller 11 controls the instruction register 11B and the data register 12A in the control register 12 by outputting control signals in accordance with the supplied test clock tck and the test mode signal tms: A clock signal clock-IR, a shift signal shift-IR, and an update signal update-IR are supplied to the instruction register (IR) 11B; and a clock signal clock-DR, a shift signal shift-DR, and an update signal update-DR are supplied to the data register (DR) 12A. The instruction register 11B holds a test instruction in accordance with the test data input signal tdi and the control signals (the clock signal clock-IR, the shift signal shift-IR, and the update signal update-IR) supplied from the state machine 11A. The output of the instruction register 11B is connected to the instruction decoder 11C. The instruction decoder 11C decodes the test instruction and outputs the register control signal S11 to the control register 12.

The data register 12A in the control register 12 holds control data, which is the result of test mode selection, in accordance with the test data input signal tdi, the control signals (the clock signal clock-IR, the shift signal shift-IR, and the update signal update-IR) supplied from the state machine 11A, and the control signal ctrl_or, which is logical OR obtained by the OR circuit 12C. The output of the data register 12A is connected to the data decoder 12B. The data decoder 12B decodes the control data into three BIST control signals ctrl (ctrl 0, ctrl1, and ctrl2), for instance, and outputs the signals to the pattern generation circuit 20 and the data comparator 30. The output of the data decoder 12B is coupled to the OR circuit 12C. The OR circuit 12C receives the three BIST control signals ctrl0, ctrl1, and ctrl2, and outputs a logical OR as the control signal ctrl_or to the data register 12A.

Figure 5:
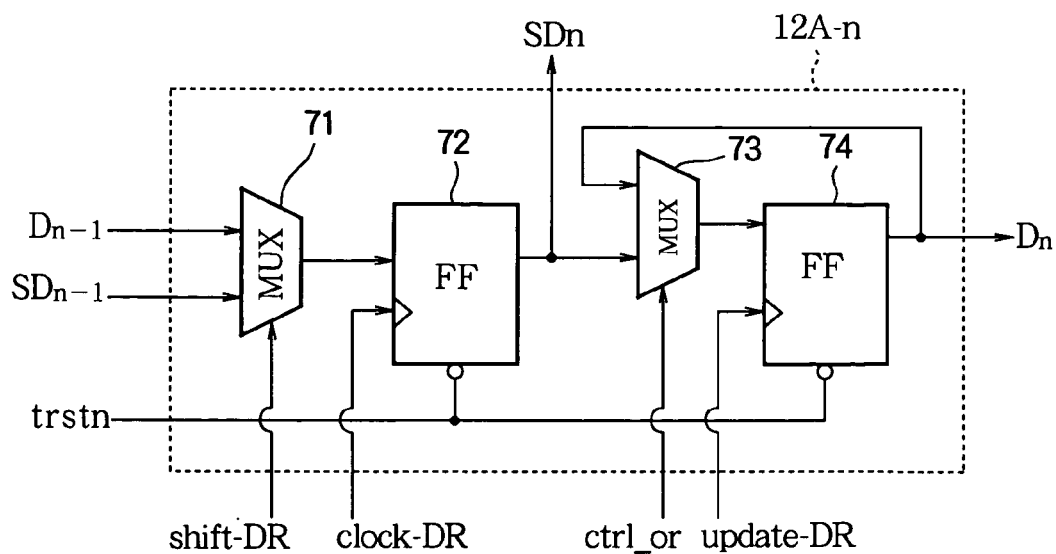
FIG. 5 is a block diagram showing a schematic configuration of a one-bit unit data register of the multibit data register shown in FIG. 4.

FIG. 5 is a block diagram showing a schematic configuration of a one-bit unit data register 12A-n included in the multibit data register 12A shown in FIG. 4.

The multibit data register 12A has a plurality of one-bit unit data registers 12A-n cascaded in the shift data output side (n is a positive integer and indicates that the register is in the n-th position in the cascaded registers). Each unit data register 12A-n includes a multiplex (MUX) circuit 71, a FF circuit 72 coupled to the output of the MUX circuit 71, a second MUX circuit 73 coupled to the output of the FF circuit 72, and a second FF circuit 74 coupled to the output of the MUX circuit 73. The MUX circuit 71 selects either input data $D_{n-1}$ or shift data $SD_{n-1}$ input from the previous unit data register 12A-n, in accordance with the shift signal shift-DR from the state machine 11A. The FF circuit 72 shifts the data output from the MUX circuit 71 in accordance with the clock signal clock-DR and outputs the shift data $SD_n$ to the next-stage unit data register 12A-(n+1). The FF circuit 72 is reset when test reset signal trstn is brought low (a period from t5 to t6 shown in FIG. 6). The MUX circuit 73 selects and outputs either the shift data $SD_n$ from the FF circuit 72 or the data $D_n$ from the FF circuit 74, in accordance with the control signal ctrl_or. The FF circuit 74 holds the data output from the MUX circuit 73 in accordance with the update signal update-DR, and sends the output data back to the input of the MUX circuit 73. The FF circuit 74 is reset when the test reset signal trstn is brought low (a period from t5 to t6 shown in FIG. 6).

In the unit data register 12A-n, when the shift signal shift-DR is '0', the MUX circuit 71 outputs the input data $D_{n-1}$ to the FF circuit 72. When the shift signal shift-DR is '1', the MUX circuit 71 outputs the shift data $SD_{n-1}$ supplied from the previous-stage unit data register 12A-n to the FF circuit 72. The FF circuit 72 shifts the data output from the MUX circuit 71 in accordance with the clock signal clock-DR and sends the shift data $SD_n$ to both the next-stage unit data register 12A-(n+1) and the MUX circuit 73. When the control signal ctrl_or is '0', the MUX circuit 73 outputs the shift data $SD_n$ to the FF circuit 74. When the control signal ctrl_or is '1', the MUX circuit 73 outputs the data $D_n$ supplied from the FF circuit 74 to the FF circuit 74. The FF circuit 74 holds data supplied from the MUX circuit 73 in accordance with the update signal update-DR. The MUX circuit 73 and the FF circuit 74 form a data latch circuit.

As has been described above, the unit data register 12A-n can shift the shift data supplied from the previous-stage unit data register 12A-(n−1) and successively send the data to the next unit data register 12A-(n+1) in accordance with the control signals shift-DR and clock-DR. The unit data register 12A-n can also output the data held in the data latch circuit formed by the MUX circuit 73 and the FF circuit 74 to the data decoder 12B in accordance with the update signal update-DR. When the control signal ctrl_or is '1', the data output from the FF circuit 72 is not accepted, and the data in the data latch circuit formed by the MUX circuit 73 and the FF circuit 74 is held further. The held data is cleared just when the test reset signal trstn is brought low and is not rewritten otherwise. The data latch circuit formed by the MUX circuit 73 and the FF circuit 74 keeps holding and outputting the data.

Figure 6:
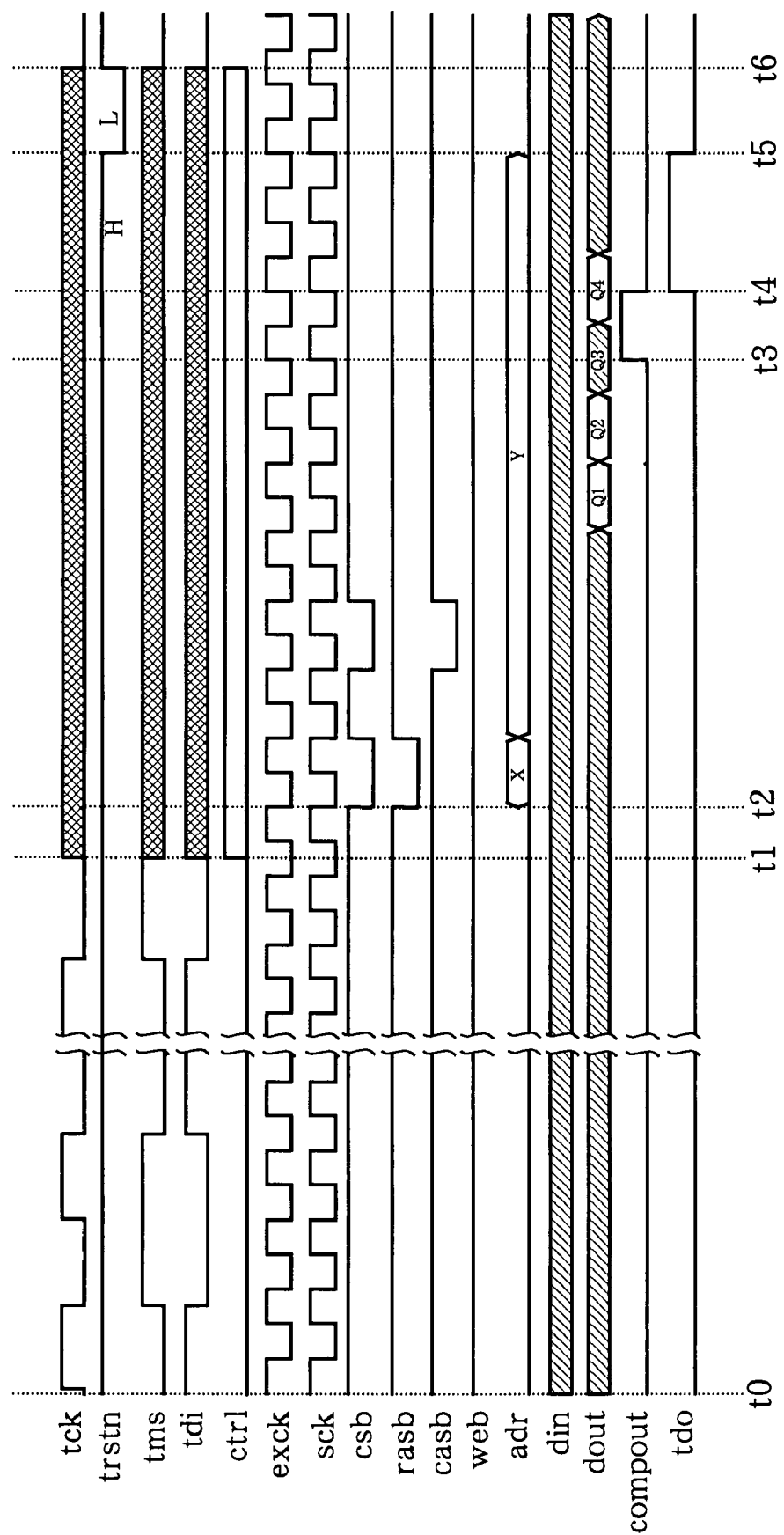
FIG. 6 is an operation timing diagram for describing operations of the BIST circuit of the first embodiment.

FIG. 6 is an operation timing diagram for describing an operation of the BIST circuit 1 of the first embodiment (the testing method of the first embodiment). The timing diagram shows a read operation of the SDRAM 50.

A write operation for testing the SDRAM 50 will be described first briefly. The tester 65 supplies the serial test clock tck, the test mode signal tms, the test data input signal tdi, and the external clock exck to the BIST circuit 1. The BIST control circuit 10 in the BIST circuit 1 outputs the multibit BIST control signal ctrl in synchronization with test clock tck. The pattern generation circuit 20 is triggered by the multibit BIST control signal ctrl and generates and supplies the clock sck, the multibit commands csb, rasb, casb, and web, the multibit address adr, and the multibit input data din to the SDRAM 50, in synchronization with the external clock exck. The multibit input data din supplied to the SDRAM 50 is successively written into memory cells of the memory cell arrays 61-1 and 61-2 shown in FIG. 3.

The read operation of the SDRAM 50 will next be described with reference to FIG. 6.

When the tester 65 supplies the BIST circuit 1 with the test clock tck, the test mode signal tms, and the test data input signal tdi, at time t0 in FIG. 6, a test pattern and data for determining a test mode such as an address scan method are input to the BIST control circuit 10. The external clock exck from the tester 65 is supplied to the buffer 25 in the pattern generation circuit 20, and the clock sck synchronized with the external clock exck is output from the buffer 25 and supplied to the SDRAM 50.

The BIST control circuit 10 selects a test mode at time t1. Corresponding multibit BIST control signal ctrl is brought high and output from the control register 12 to the pattern generation circuit 20 and the data comparator 30 in synchronization with the test clock tck. In the control register 12, when the control signal ctrl is high, the control signal ctrl_or supplied from the OR circuit 12C to the data register 12A goes high. Then, the FF circuit 74 in the data register 12A keeps holding and outputting data independently of the test clock tck, the test mode signal tms, and the test data input signal tdi (regardless of whether the input pattern is interrupted or whether the contents of the pattern are altered) until the BIST control signal ctrl goes low.

When the BIST control signal ctrl goes high, the state machine 11A is triggered to operate in synchronization with the external clock exck. In the pattern generation circuit 20, the command generation circuit 22 generates the commands csb, rasb, casb, and web, and the address generation circuit 23 generates the address adr, at time t2. A test pattern of the commands csb, rasb, casb, and web and the address adr is supplied to the SDRAM 50. Moreover, the data generation circuit 24 generates and supplies the input data din to the SDRAM 50 and the data comparator 30.

The control signal csb goes low, and the control signal rasb goes low. Then, when the control signal casb goes low, the test data Q1, Q2, Q3, Q4, and so on are successively read from the memory cell arrays 61-1 and 61-2 shown in FIG. 3 and supplied as output data dout to the data comparator 30.

In the data comparator 30, the FF circuit 31 is driven by the BIST control signal ctrl. The FF circuit 31 takes the output data dout in synchronization with the external clock exck. The XOR circuits 32 and 33 compare the output data dout and the input data din of the expected values. If the output data dout match the input data din of the expected values, the comparison result compout output from the XOR circuit 33 goes low. If the data do not match, the comparison result compout goes high.

If the data Q3 of the output data dout from the SDRAM 50 at time t3 indicates that there is a defect, the comparison result compout supplied from the data comparator 30 goes high.

In the output control circuit 40, the comparison result compout is supplied to the OR circuit 41 at time t4 and is taken in the FF circuit 42 in synchronization with the external clock exck, and this state is kept. The test data output signal tdo supplied in synchronization with the external clock exck is given to the tester 65. The tester 65 can evaluate the SDRAM 50 on a pass/fail basis in accordance with the test data output signal tdo.

When the tester 65 brings the test reset signal trstn low at time t5, the FF circuits 72 and 74 in the data register 12A are reset, and the BIST control signal ctrl goes low. In addition, the FF circuit 42 in the output control circuit 40 is reset, and the test data output signal tdo goes low.

When the tester 65 brings the test reset signal trstn high at time t6, the operations after time t0 can be repeated. The FF circuit 74 in the data register 12A holds data output in the period from time t1 to time t6 (a period indicated by the crosshatched sections of the test clock tck, the test mode signal tms, and the test data input signal tdi in FIG. 6), so that any input state of the test clock tck, the test mode signal tms, and the test data input signal tdi will not affect the BIST operation.

As has been described above, the first embodiment uses the control register 12 which is written after a reset is made in accordance with a reset signal and holds the written data until a reset is made in accordance with a subsequent reset signal trstn (a period from time t1 to time t6 in FIG. 6). The control register 12 holds the written data until a reset is made in accordance with the reset signal trstn. Any change in data input to the BIST circuit 1 will not change the data held in the control register 12 unless a reset is made in accordance with the reset signal trstn. While the SDRAM 50 is being tested by generating a test pattern based on data held in the control register 12, supplying the SDRAM 50 with data based on the test pattern, and evaluating the performance of the SDRAM 50 in accordance with the data dout output from the SDRAM 50, the test clock tck, the test mode signal tms, and the test data signal tdi input to the control register 12 will not affect the test operation. Accordingly, with the BIST circuit 1 or the test method of the first embodiment, a given test can be finished without any interruption even if the test pattern (the test clock tck, the test mode signal tms, and the test data signal tdi) input to the BIST circuit 1 is interrupted or modified during the test.

The test clock tck is supplied from the tester 65 in the embodiment described above, but the BIST circuit 1 may include an oscillator for generating the test clock tck.

The external clock exck is supplied from the tester 65 in the embodiment described above, however, the BIST circuit 1 may include an oscillator for generating the external clock exck.

<Second Embodiment>

Figure 7:
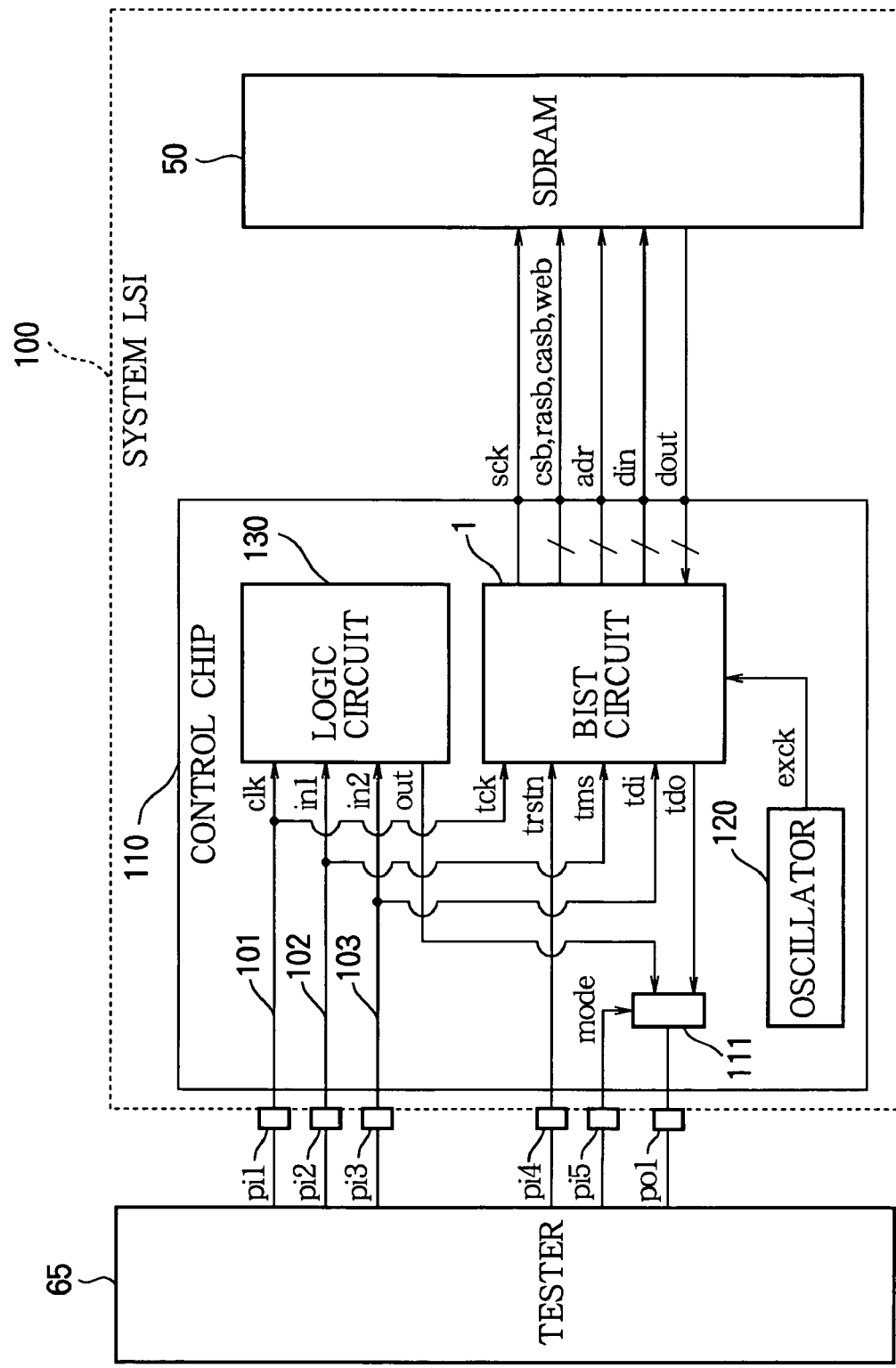
FIG. 7 is a block diagram showing a schematic configuration of a system LSI circuit, which is a semiconductor integrated circuit device of a second embodiment of the present invention, and a tester.
Figure 8:
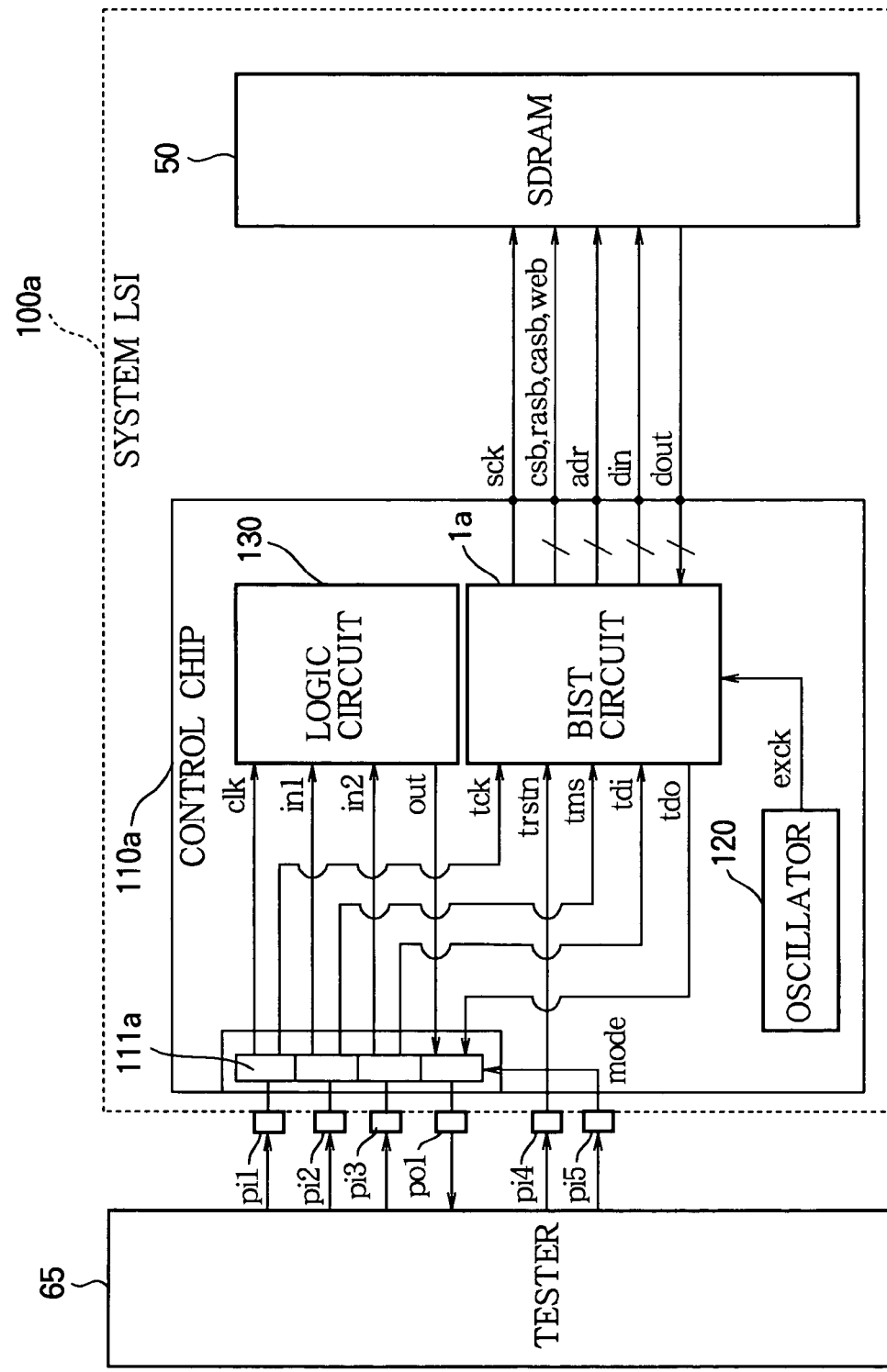
FIG. 8 is a block diagram showing a schematic configuration of a comparative circuit for the second embodiment.

FIG. 7 is a block diagram showing a schematic configuration of a system LSI circuit 100, which is a semiconductor integrated circuit device according to a second embodiment of the present invention, and the tester 65 connected to the system LSI circuit 100. FIG. 8 is a block diagram showing a schematic configuration of a comparative circuit for the second embodiment.

In a comparative system LSI circuit 100a shown in FIG. 8, common terminals pi1 to pi3 and po1 are connected to a selector 111a for selecting a signal. The selector 111a selects and connects one of the common terminals to a BIST circuit 1a or a logic circuit 130 in a control chip 110a. This configuration allows the number of external terminals of the system LSI circuit 100a to be reduced, but the following problem arises. Because the input of the test pattern to the BIST circuit 1a cannot be interrupted while the SDRAM 50 is being tested by using the BIST circuit 1a, the SDRAM 50 and the logic circuit 130 cannot be tested concurrently. Because the selector 111a selects and gives the input signals to the BIST circuit 1a or the logic circuit 130, a signal delay caused by an element included in the selector 111a will delay a test operation. Because the selector 111a contains a plurality of switching blocks (four switching blocks in FIG. 8), the system LSI circuit will have a large footprint.

The semiconductor integrated circuit device of the second embodiment uses the BIST circuit 1 of the first embodiment described above, so that the SDRAM 50 and the logic circuit 130 can be tested concurrently, and a delay in test operation and an increase in footprint can be avoided.

The system LSI circuit 100 of the second embodiment shown in FIG. 7 includes a control chip 110 for controlling the entire system and the SDRAM 50 in a single package. The package of the system LSI circuit 100 has test terminal blocks pi1 to pi5 and po1 for connecting the tester 65 electrically. The package has other external terminals (not shown) as required for an application. The test terminal blocks shown in FIG. 7 are the input terminals pi1 to pi5 and the output terminal po1.

The input terminal pi1 is a common terminal (first clock terminal) for supplying a first clock, or test clock tck, and a third clock clk for testing the logic circuit 130, through a common wiring 101 to both the BIST circuit 1 and the logic circuit 130. The input terminal pi2 is a common terminal (first input terminal) for supplying the test mode signal tms and the first input signal in1, through a common wiring 102 to both the BIST circuit 1 and the logic circuit 130. The input terminal pi3 is a common terminal (second input terminal) for supplying the test data input signal tdi and the second input signal in2, through a common wiring 103 to both the BIST circuit 1 and the logic circuit 130. The input terminal pi4 is a terminal for supplying the test reset signal trstn to the BIST circuit 1. The input terminal pi5 is a terminal for supplying the mode signal 'mode' to a selector 111. The output terminal po1 is a common terminal for outputting the test data output signal tdo from the BIST circuit 1 to the outside or outputting the output signal 'out' from the logic circuit 130 to the outside.

The control chip 110 includes the selector 111, the BIST circuit 1 shown in FIG. 1 and FIG. 2 (first embodiment), a clock generation means, and the logic circuit 130 such as a CPU, and these elements are formed on a single semiconductor substrate. The selector 111 selects and outputs either the internal test data output signal tdo or the output signal 'out' to the outside. The clock generation means (an oscillator 120, for instance) generates the external clock exck. The logic circuit 130 performs logical processing for controlling the entire system LSI circuit.

The output of the selector 111 is coupled to the output terminal pot, and the input is supplied with the test data output signal tdo and the output signal 'out'. The selector 111 selects either the test data output signal tdo or the output signal 'out' in accordance with the mode signal 'mode' and outputs the selected signal to the output terminal po1. The selector 111 includes a gate circuit and the other circuit.

The BIST circuit 1 has a terminal of the test clock tck coupled to the input terminal pi1 via the common wiring 101, a terminal of the test mode signal tms coupled to the input terminal pi2 via the common wiring 102, a terminal of the test data input signal tdi coupled to the input terminal pi3 via the common wiring 103, a terminal of the test reset signal trstn coupled to the input terminal pi4, a terminal of the test data output signal tdo coupled to the selector 111, and an input terminal of the external clock exck. The BIST circuit 1 also has an input terminal for inputting the output data dout of the SDRAM 50 and terminals for outputting the signals to be input to the SDRAM 50 (the clock sck, the commands csb, rasb, casb, and web, the address adr, and the input data din).

The logic circuit 130 has a terminal of the clock clk coupled to the input terminal pit via the common wiring 101, a terminal of the input signal in1 coupled to the input terminal pi2 via the common wiring 102, a terminal of the input signal in2 coupled to the input terminal pi3 via the common wiring 103, and a terminal of the output signal out coupled to the selector 111. The logic circuit 130 has functions for performing a logical operation of the test input signals in1 and in2 supplied from the tester 65 in synchronization with the testing clock clk and outputting the test result as the output signal 'out' to the tester 65.

Figure 9:
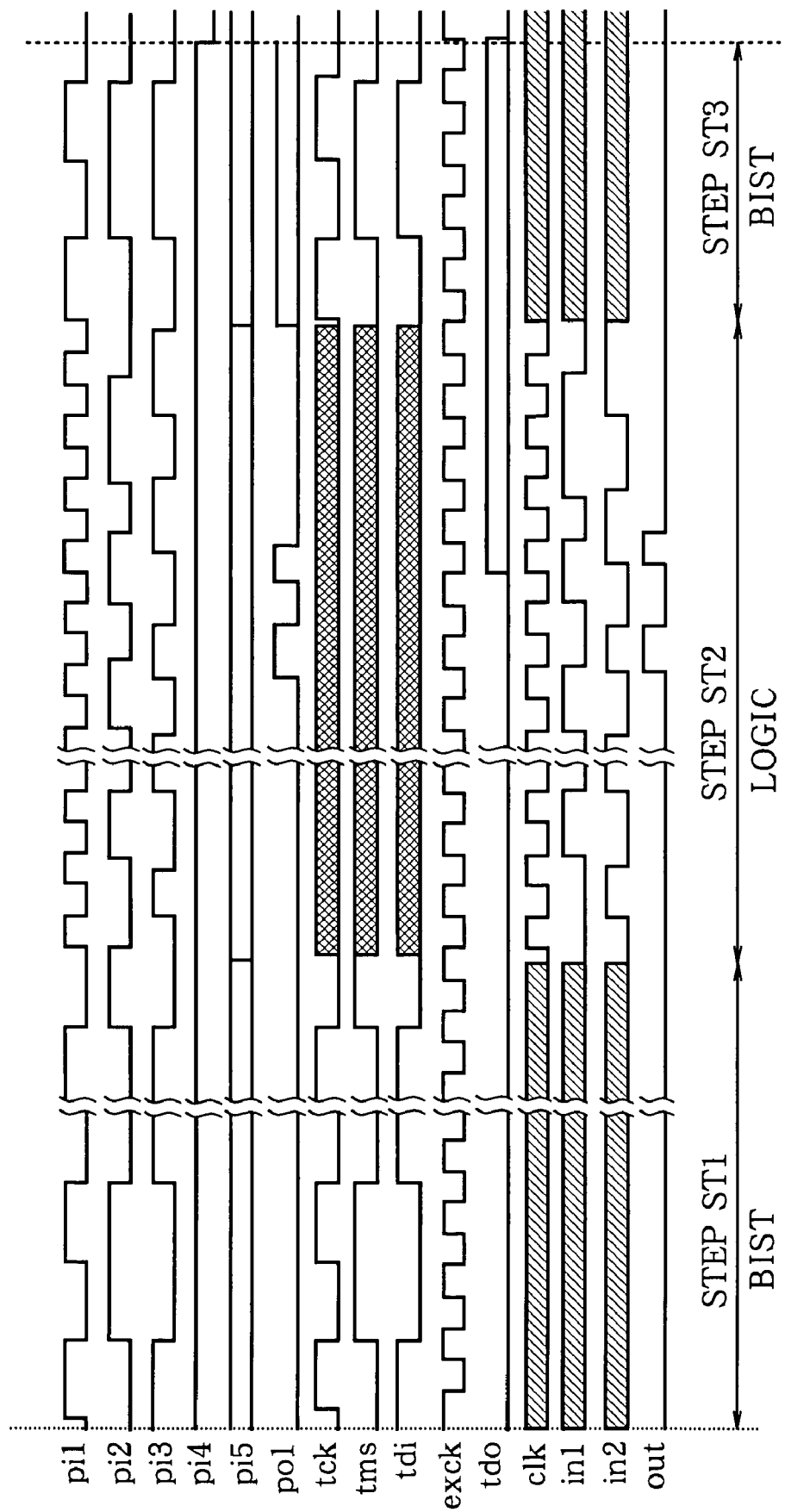
FIG. 9 is an operation timing diagram for describing operations of the semiconductor integrated circuit device of the second embodiment.

FIG. 9 is an operation timing diagram showing a test operation (testing method) of the system LSI circuit 100 shown in FIG. 7.

When the test starts, the tester 65 supplies the input terminal pi1 to pi3 of the system LSI circuit 100 with the input signals in step ST1. The input signals are supplied to both the logic circuit 130 and the BIST circuit 1, but a certain input pattern is given in step ST1 so that the signals become significant in the BIST circuit 1, for instance. Accordingly, the test mode signal tms and the test data input signal tdi (data for determining a test mode such as address scan method and a test pattern) are supplied to the BIST circuit 1 in synchronization with the test clock tck, and the BIST circuit 1 is activated.

In step ST2, the activated BIST circuit 1 generates the clock sck, the commands csb, rasb, casb, and web, and the address adr to be supplied to the SDRAM 50 and tests the SDRAM 50, in the test mode determined in step ST1, in synchronization with the external clock exck supplied from the oscillator 120. In step ST2 (period indicated by cross-hatched sections of the test clock tck, the test mode signal tms, and the test data input signal tdi in FIG. 6 or FIG. 9), the BIST circuit 1 operates in synchronization with the external clock exck, independently of any other input signal. In other words, even if the input signals for operating the logic circuit 130 are supplied from the common terminals pi1, pi2, and pi3 through the common wirings 101, 102, and 103, the operation of the BIST circuit 1 will not be affected.

To test the logic circuit 130 in parallel with the BIST circuit 1, for instance, the tester 65 supplies input terminals pi1 to pi3 of the system LSI circuit 100 with the input signals in step ST2. An input pattern significant to the logic circuit 130 is given in step ST2, and the selector 111 selects the output signal 'out' of the logic circuit 130 in accordance with the mode signal 'mode'. The logic circuit 130 is tested, the result is supplied as the output signal 'out' from the external terminal po1 to the tester 65, and then the logic circuit 130 is evaluated on a pass/fail basis.

In step ST3, the selector 111 selects the test data output signal tdo of the BIST circuit 1 in accordance with the mode signal 'mode'. The test result of the SDRAM 50 is supplied as the test data output signal tdo from the output terminal po1 to the tester 65, and the SDRAM 50 is evaluated on a pass/fail basis. Then, the tester 65 supplies the test reset signal trstn through the input terminal pi4 to the BIST circuit 1. The BIST circuit 1 is reset, and the test finishes.

As has been described above, the system LSI circuit 100, or the semiconductor integrated circuit device of the second embodiment, includes the logic circuit 130 and the BIST circuit 1 (BIST circuit of the first embodiment) which can finish a given test without any interruption even if the test pattern input to the register circuit is interrupted or modified while a circuit is being tested. Accordingly, while the BIST circuit 1 is testing the SDRAM 50 (step ST2), the input signals can be supplied to the logic circuit 130 through the common terminals pi1, pi2, and pi3 and the common wirings 101, 102, and 103. Therefore, the semiconductor integrated circuit device of the second embodiment can supply signals to the test circuit and the logic circuit, without having a circuit for selecting input signals (such as a large-scale selector 111a in the comparative circuit shown in FIG. 9), so that the footprint can be reduced. In addition, because a signal delay due to the conventional input selector is eliminated, a high-speed test can be carried out.

<Modified Embodiments>

The present invention is not limited to the configurations of the first and second embodiments described above, and a variety of modifications are possible as described below.

Figure 10:
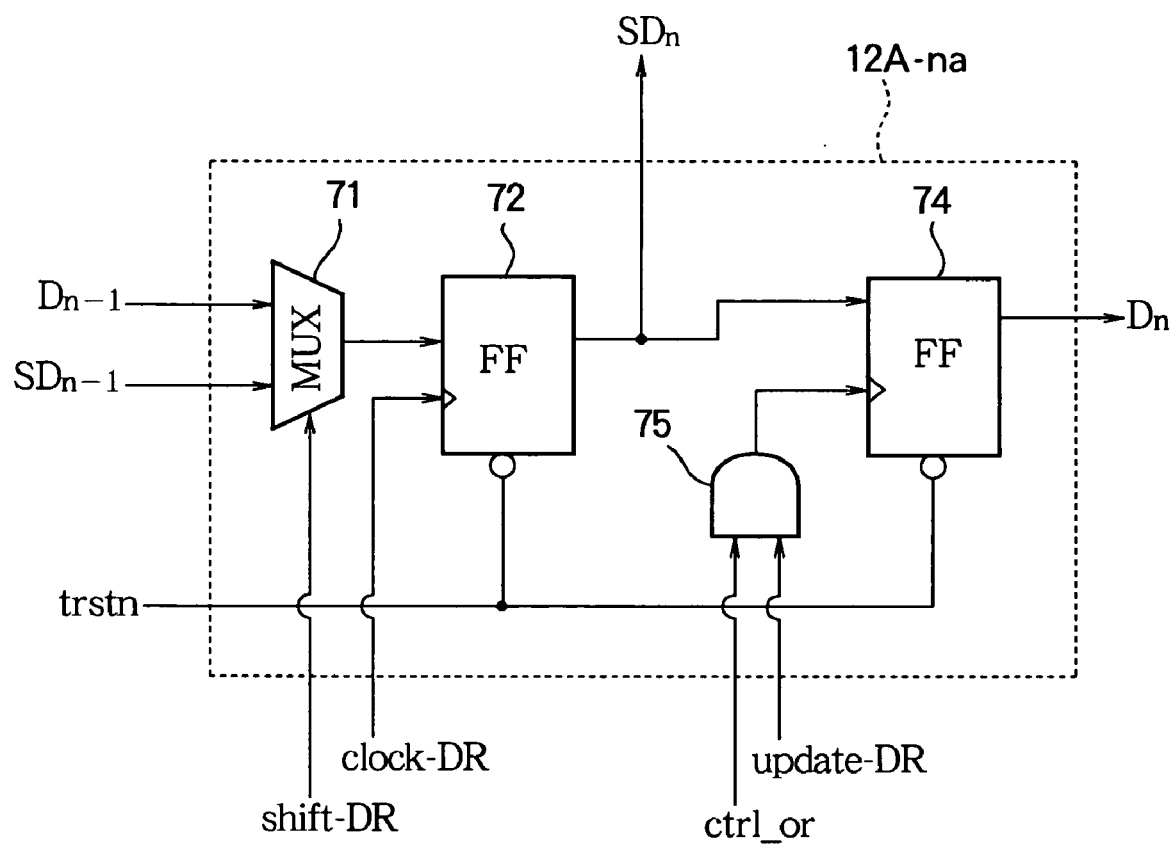
FIG. 10 is a block diagram showing a schematic configuration of another unit data register.

The data latch circuit in the unit data register 12A-n of the first embodiment includes the MUX circuit 73 and the FF circuit 74, as shown in FIG. 5. Like a unit data register 12A-na shown in FIG. 10, the unit data register may not include the MUX circuit 73 shown in FIG. 5 and may be configured to input the control signal ctrl_or and the update signal update_DR to a two-input logical AND gate (AND circuit) 75, to input the output signal of the AND circuit 75 to the clock input terminal of the FF circuit 74, and to connect the data input terminal of the FF circuit 74 to the data output terminal of the FF circuit 72. This configuration uses the AND logic to obtain a gated clock from the update signal update_DR. Data can be held in the configuration shown in FIG. 10, in the same manner as in the configuration shown in FIG. 5.

The semiconductor integrated circuit device of the second embodiment described above includes the BIST circuit 1 and one logic circuit 130 connected in parallel, as shown in FIG. 7. The present invention can also be applied to a semiconductor integrated circuit device including the BIST circuit 1 and a plurality of logic circuits connected in parallel.

In the first and second embodiments described above, the circuit to be tested is the SDRAM 50. The present invention, however, can be applied to a variety of circuits to be tested including semiconductor memories such as a static RAM (SRAM), a flash ROM, and a production programmed ROM (P2ROM) and a semiconductor integrated circuit such as a logic circuit.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A test circuit comprising:
   a register circuit, into which data is written after data is cleared in compliance with a reset instruction executed by a reset signal, the register circuit holding the written data until a reset instruction is executed by a subsequent reset signal;
   a first circuit which receives a signal for selecting a test mode to be applied for testing a circuit to be tested, and writes the data into the register circuit in accordance with the signal for selecting a test mode in synchronization with a first clock;
   a second circuit which generates a test pattern in accordance with the data held in the register circuit, and outputs data based on the test pattern to the circuit to be tested in synchronization with a second clock; and
   a third circuit which receives data output from the circuit to be tested in synchronization with the second clock, and makes an evaluation of performance of the circuit to be tested in accordance with the test pattern and the data output from the circuit to be tested.

2. The test circuit according to claim 1 further comprising:
   a fourth circuit which outputs a result of the evaluation made by the third circuit to outside in synchronization with the second clock.

3. The test circuit according to claim 1, wherein the evaluation made by the third circuit is performed by judging whether the test pattern and the data output from the circuit to be tested match or do not match.

4. The test circuit according to claim 1, wherein
   the first clock is a clock supplied to the first circuit from outside of the first circuit; and
   the second clock is a clock supplied to the second and third circuits from outside of the second and third circuits.

5. The test circuit according to claim 1 further comprising:
   an oscillator which generates the second clock.

6. The test circuit according to claim 1, wherein the second clock has the same frequency as an actual operating frequency of the circuit to be tested.

7. A semiconductor integrated circuit device comprising:
   the test circuit of claim 1, formed on a semiconductor substrate;
   a logic circuit formed on the semiconductor substrate;
   a first common wiring which is formed on the semiconductor substrate and connected to both the first circuit of the test circuit and the logic circuit; and
   a first common terminal which is formed on the semiconductor substrate and connected to the first common wiring.

8. The semiconductor integrated circuit device according to claim 7, wherein the first common terminal receives the first clock or a third clock for giving a timing of operation of the logic circuit.

9. The semiconductor integrated circuit device according to claim 8 further comprising:
a second common wiring which is formed on the semiconductor substrate and connected to both the first circuit of the test circuit and the logic circuit; and
a second common terminal which is formed on the semiconductor substrate and connected to the second common wiring, and receives a signal output from the test circuit or a signal output from the logic circuit.

10. The semiconductor integrated circuit device according to claim 7, wherein the first common terminal receives the signal for selecting a test mode or data for operating the logic circuit.

11. A method for testing a circuit to be tested, using a test circuit including a register circuit, into which data is written after data is cleared in compliance with a reset instruction executed by a reset signal, the register circuit holding the written data until a reset instruction is executed by a subsequent reset signal; the method comprising:
supplying the test circuit with a signal for selecting a test mode to be applied for testing a circuit to be tested, and writing the data into the register circuit in accordance with the signal for selecting a test mode in synchronization with a first clock;
generating a test pattern in accordance with the data held in the register circuit, and outputting data based on the test pattern to the circuit to be tested in synchronization with a second clock; and supplying the test circuit with data output from the circuit to be tested in synchronization with the second clock, and making an evaluation of performance of the circuit to be tested in accordance with the test pattern and the data output from the circuit to be tested.

12. The method according to claim 11, further comprising:
outputting a result of the evaluation to outside in synchronization with the second clock.

13. The method according to claim 11, wherein the evaluation is performed by judging whether the test pattern and the data output from the circuit to be tested match or do not match.

* * * * *